United States Patent
Kim (10) Patent No.: US 7,384,865 B2
(45) Date of Patent: Jun. 10, 2008

(54) SEMICONDUCTOR DEVICE WITH A METAL LINE AND METHOD OF FORMING THE SAME

(75) Inventor: Seok-Su Kim, Gyeonggi-do (KR)

(73) Assignee: Dongbuanam Semiconductor, Inc. (KR)

(*) Notice: Subject to any disclaimer, the term of this patent is extended or adjusted under 35 U.S.C. 154(b) by 125 days.

(21) Appl. No.: 11/313,723

(22) Filed: Dec. 22, 2005

(65) Prior Publication Data

US 2006/0160355 A1 Jul. 20, 2006

(30) Foreign Application Priority Data

Dec. 23, 2004 (KR) .................. 10-2004-0111572

(51) Int. Cl.
*H01L 21/283* (2006.01)
(52) U.S. Cl. .............. 438/624; 438/626; 438/631; 438/637; 438/645; 257/758; 257/760
(58) Field of Classification Search ............. 438/622, 438/624, 626, 629, 631, 634, 637, 645, FOR. 355; 257/758, 760
See application file for complete search history.

(56) References Cited

U.S. PATENT DOCUMENTS

2005/0054191 A1* 3/2005 Yu et al. .................. 438/629
2005/0112867 A1* 5/2005 Kim ........................ 438/622
2005/0121792 A1* 6/2005 Harada .................... 257/758
2005/0200026 A1* 9/2005 Liaw ....................... 257/774

* cited by examiner

*Primary Examiner*—George Fourson
*Assistant Examiner*—Joannie A Garcia
(74) *Attorney, Agent, or Firm*—Finnegan Henderson Farabow Garrett & Dunner LLP (57) ABSTRACT

A method of forming a metal line in a semiconductor device includes: forming a lower insulation layer for insulation from the lower substrate; forming a first metal line at a certain region on the lower insulation layer; sequentially forming a first oxide layer, an FSG (Fluorine-doped Silicate Glass) layer, and a second oxide layer on the lower insulation layer and the first metal line; removing the first oxide layer, the FSG layer, and the second oxide layer so as to expose the first metal line; forming an upper insulation layer on the lower insulation layer and the first metal line; forming a contact hole by etching the upper insulation layer to a degree that the first metal line is exposed; and forming a second metal line by depositing a metal material in the contact hole.

8 Claims, 9 Drawing Sheets

SEMICONDUCTOR DEVICE WITH A METAL LINE AND METHOD OF FORMING THE SAME

CROSS-REFERENCE TO RELATED APPLICATION

This application claims priority to and the benefit of Korean Patent Application No. 10-2004-0111572 filed in the Korean Intellectual Property Office on Dec. 23, 2004, the entire contents of which are incorporated herein by reference.

BACKGROUND (a) Technical Field

The present invention relates to a semiconductor device with a metal line and a method of forming the same. More particularly, the present invention relates to a method of forming a metal line in a semiconductor device having the advantages of preventing the penetration of fluorine (F) in an FSG (fluorine-doped silicate glass) layer into a metal line.

(b) Description of the Related Art

As semiconductor devices have become more highly integrated, both a cell size and a pitch of a metal line have been reduced. Such a reduction of a pitch of a metal line may increase the wire resistance and capacitance created between adjacent metal lines. This may result in a lowering of the operation speed of a semiconductor device. Since metal lines having a multi-layer structure are required for solving the above-mentioned problems, a planarization process for an interlayer insulation layer insulating between a lower metal line pattern and an upper metal line pattern is necessarily performed in a multi-layer wiring process.

In addition, as semiconductor devices have become more highly integrated, a space between metal lines has become more narrow. Such a reduction of space between metal lines may induce a parasitic capacitance between adjacent metal lines, and such a parasitic capacitance causes a delay in a time constant (RC) and an increase of power consumption. Therefore, an interlayer insulation layer material having a low-k (low dielectric constant) is required for solving such problems caused by parasitic capacitance. Accordingly, an interlayer insulation layer material may be composed of FSG (fluorine-doped silicate glass) having a dielectric constant of 3 to 3.5 rather than BPSG (boro-phospho-silicate glass), PSG (Phospho silicate glass), and BSG (borosilicate glass), which have a dielectric constant of 4 or more. Generally, an FSG layer is deposited by a HDP CVD (High Density Plasma Chemical Vapor Deposition) method which demonstrates an excellent ability for a gap-fill process, because both deposit and etching are simultaneously performed.

FIG. 1A to FIG. 1D are cross-sectional views showing sequential stages of a conventional method of forming a metal line in a semiconductor device.

Figure 1A:
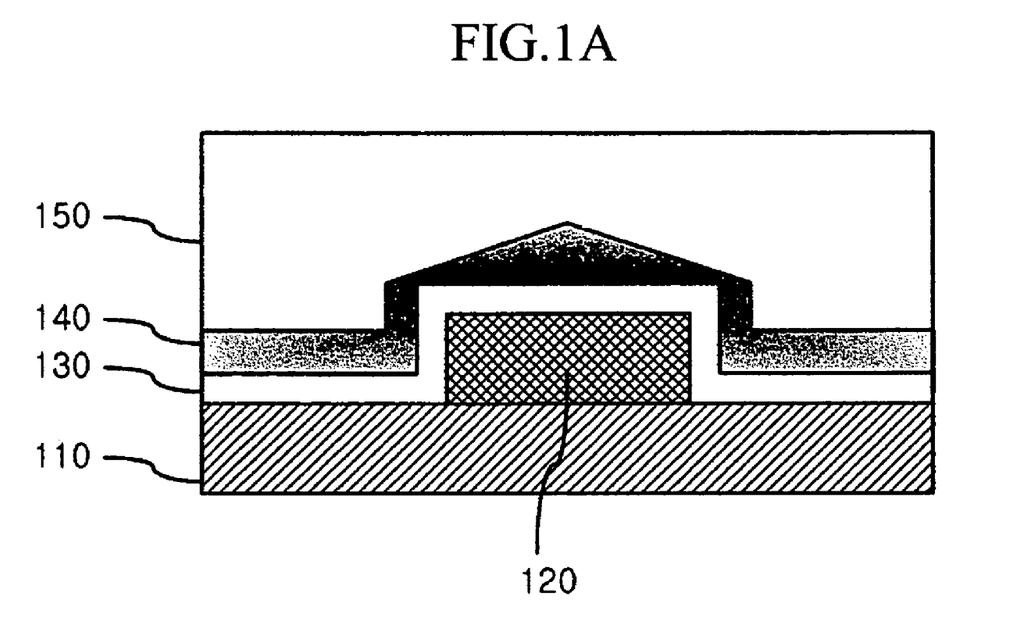
FIG. 1A to FIG. 1D are cross-sectional views showing sequential stages of a conventional method of forming a metal line in a semiconductor device.

As shown in FIG. 1A, a first metal line 120 is formed on a semiconductor substrate 110, and then a protection oxide layer 130 is thinly deposited on the first metal line 120.

In addition, an FSG layer 140 is deposited on the protection oxide layer 130 by using a HDP CVD method.

Subsequently, an upper insulation layer 150 is formed on the FSG layer 140, and a surface of the upper insulation layer 150 is planarized by a CMP (Chemical Mechanical Polishing) process.

Figure 1B:
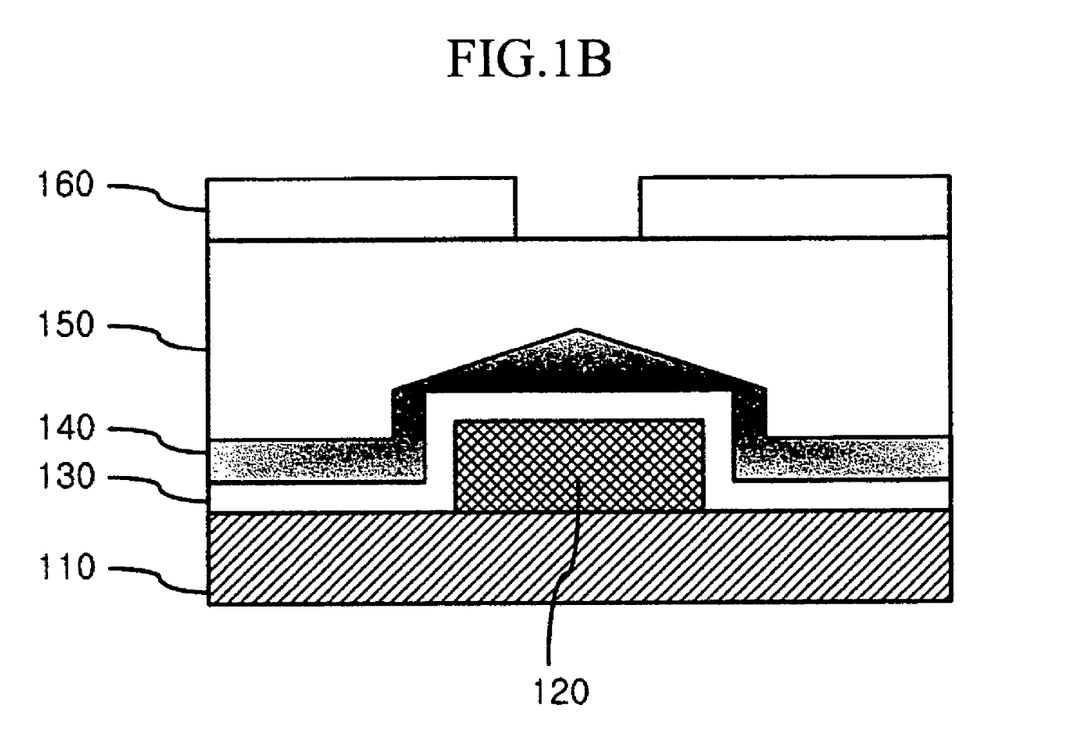

In addition, as shown in FIG. 1B, photolithography and etching processes are performed by using a contact mask 160.

Figure 1C:
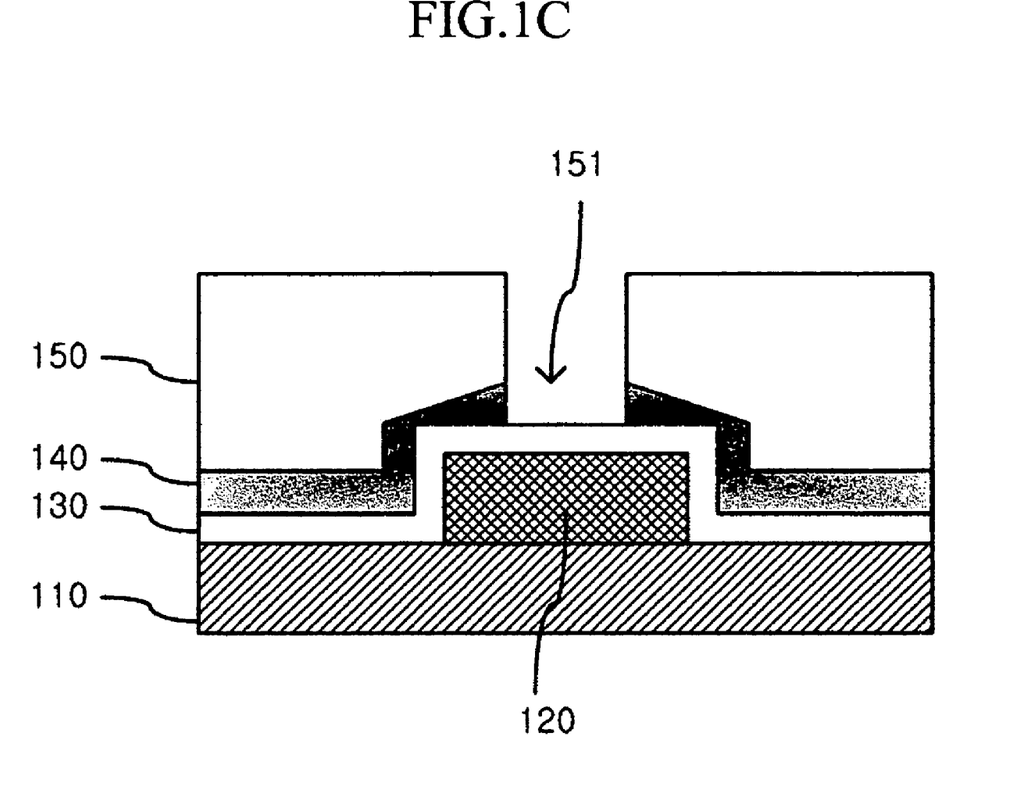

Thereafter, as shown in FIG. 1C, a contact hole 151 is formed by etching the upper insulation layer 150 and the FSG layer 140.

Figure 1D:
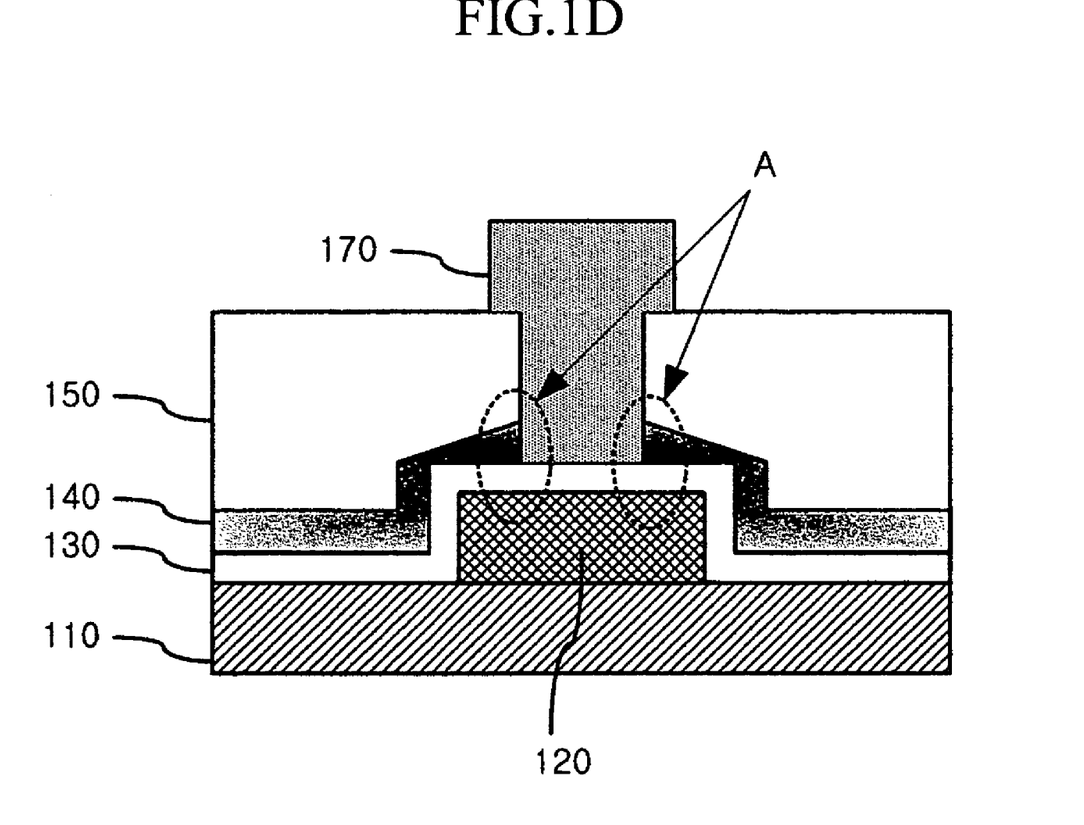

As shown in FIG. 1D, a second metal line 170 is formed by depositing a metal material in the contact hole 151.

However, as shown in FIG. 1D, a lateral side of the contact hole 151 contacts the FSG layer 140 in region A. Therefore, fluorine (F) in the FSG layer 140 penetrates into the metal line 170. Consequently, since the metal within the metal line 170 may be contaminated by fluorine (F), the contact resistance may be increased, resulting in a deterioration of the an operation speed of a semiconductor device.

The above information disclosed in this Background section is only for illustrative purposes only, and does not constitute prior art.

SUMMARY

Consistent with the present invention, there is provided a semiconductor device with a metal line and a method of forming the same having advantages of preventing contact between a metal line and an FSG layer such that a contamination of a metal line caused by fluorine in an FSG layer can be prevented.

In addition, consistent with an exemplary embodiment of the present invention, an operation speed of a semiconductor device may be increased because contact resistance may be reduced.

Further consistent with an exemplary embodiment of the present invention, a method of forming a metal line in a semiconductor device which is electrically connected to a lower substrate and exposed upward, includes: forming a lower insulation layer for insulation from the lower substrate; forming a first metal line at a certain region on the lower insulation layer; sequentially forming a first oxide layer, a FSG (Fluorine-doped Silicate Glass) layer, and a second oxide layer on the lower insulation layer and first metal line; removing the first oxide layer, the FSG layer, and the second oxide layer so as to expose the first metal line; forming an upper insulation layer on the lower insulation layer and the first metal line; forming a contact hole by etching the upper insulation layer to a degree that the first metal line is exposed; and forming a second metal line by depositing a metal material in the contact hole.

The second oxide layer may be composed of SOG (Spin-On glass) or an $O_3$-TEOS (tetra-ethyl orthosilicate) material.

The removal of the first oxide layer, the FSG layer, and the second oxide layer may be performed by using a CMP (chemical mechanical polishing) process or an etch-back process.

The second oxide layer on the lower insulation layer and the first metal line may be completely removed during the removal of the first oxide layer, the FSG layer, and the second oxide layer.

A connecting region between the first metal line and the second metal line may have a smaller width than that of the first metal line.

A semiconductor device with a metal line formed between a lower insulation layer and upper insulation layer is provided, the metal line including: a first metal line formed on the lower insulation layer; a first oxide layer formed-on the lower insulation layer, enclosing both sidewalls of the first metal line and partially connecting with the upper insulation layer; an FSG layer formed between the first oxide layer and the upper insulation layer; and a second metal line formed in the contact hole of the upper insulation layer and contacting the first metal line.

A connecting region between the first metal line and the second metal line may have a smaller width than that of the first metal line.

DETAILED DESCRIPTION OF THE EMBODIMENTS

An exemplary embodiment consistent with the present invention will hereinafter be described in detail with reference to the accompanying drawings.

In the following detailed description, only certain exemplary embodiments consistent with the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

FIG. 2A to FIG. 2D are cross-sectional views showing sequential stages of a method of forming a metal line in a semiconductor device according to an exemplary embodiment consistent with the present invention.

Figure 2A:
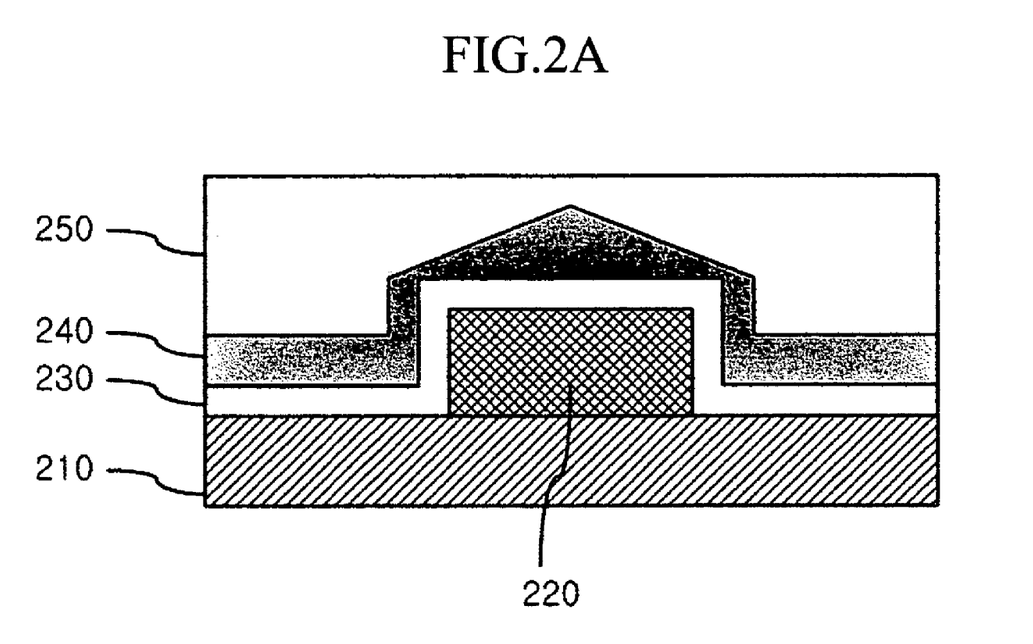
FIG. 2A to FIG. 2E are cross-sectional views showing sequential stages of a method of forming a metal line in a semiconductor device according to an exemplary embodiment consistent with the present invention.

As shown in FIG. 2A, a lower interlayer insulation layer 210 for electrical insulation from its lower part is formed on a semiconductor substrate including a transistor and a multi-layered metal line. In addition, a metal line 220 is formed on the interlayer insulation layer 210, and a protection oxide layer 230 is formed on the metal line 220. An FSG layer 240 is deposited on the protection oxide layer 230 by using an HDP CVD method.

Subsequently, a sacrificial oxide layer 250 is deposited on the FSG layer 240.

Here, since an SOG (Spin-On glass) layer or an $O_3$-TEOS (tetra-ethyl orthosilicate) layer has a fluidity great enough to simultaneously perform deposit and planarization processes, they are used for forming the sacrificial oxide layer 250.

Figure 2B:
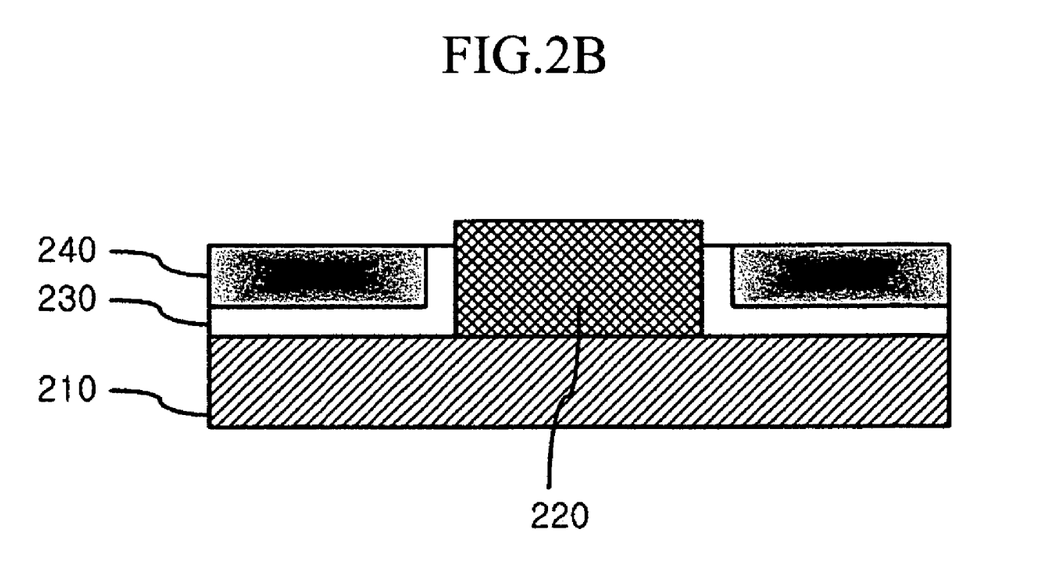

Subsequently, as shown in FIG. 2B, the upper surface of the metal line 220 is exposed by performing an etch-back process on the protection oxide layer 230, the FSG layer 240, and the sacrificial oxide layer 250, which are formed on the metal line 220. Here, the protection oxide layer 230, the FSG layer 240, and the sacrificial oxide layer 250 may also be removed by a CMP process other than an etch-back process.

Figure 2C:
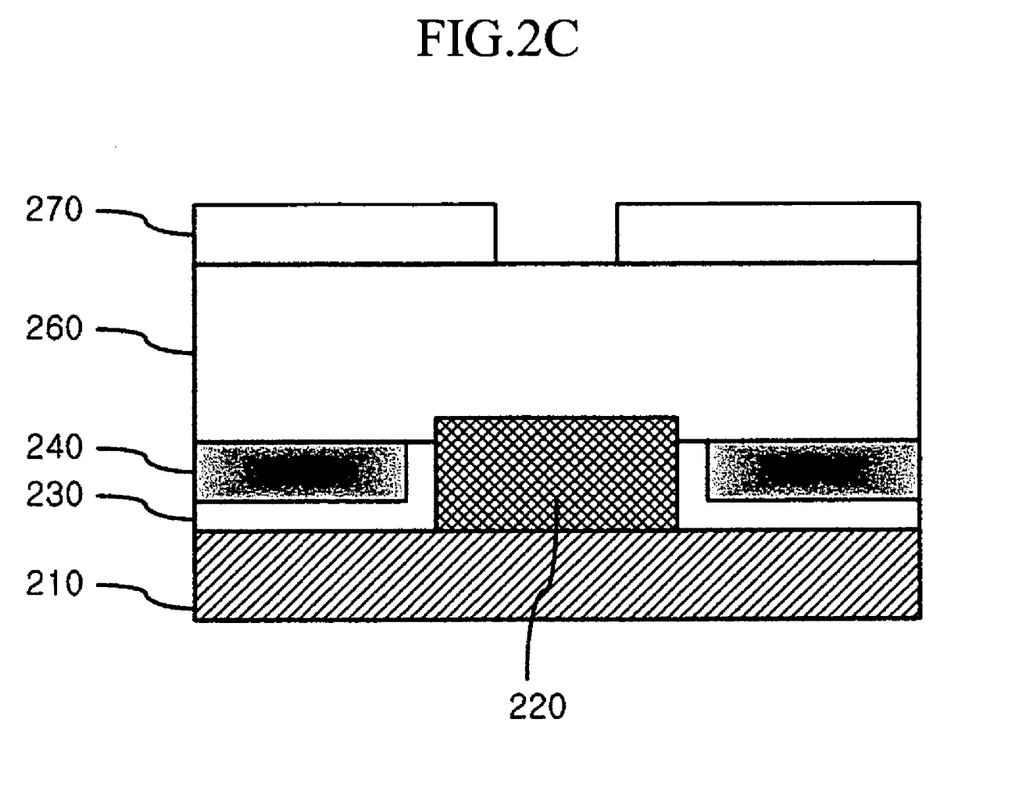

Thereafter, as shown in FIG. 2C, an upper interlayer insulation layer 260 is formed on the entire surface of the interlayer insulation layer. In addition, a mask pattern 270 is formed on the upper interlayer insulation layer 260 by performing photolithography and etching processes for a photoresist deposited on the upper interlayer insulation layer 260.

Here, the mask pattern 270 has a smaller width than the metal line 220.

Figure 2D:
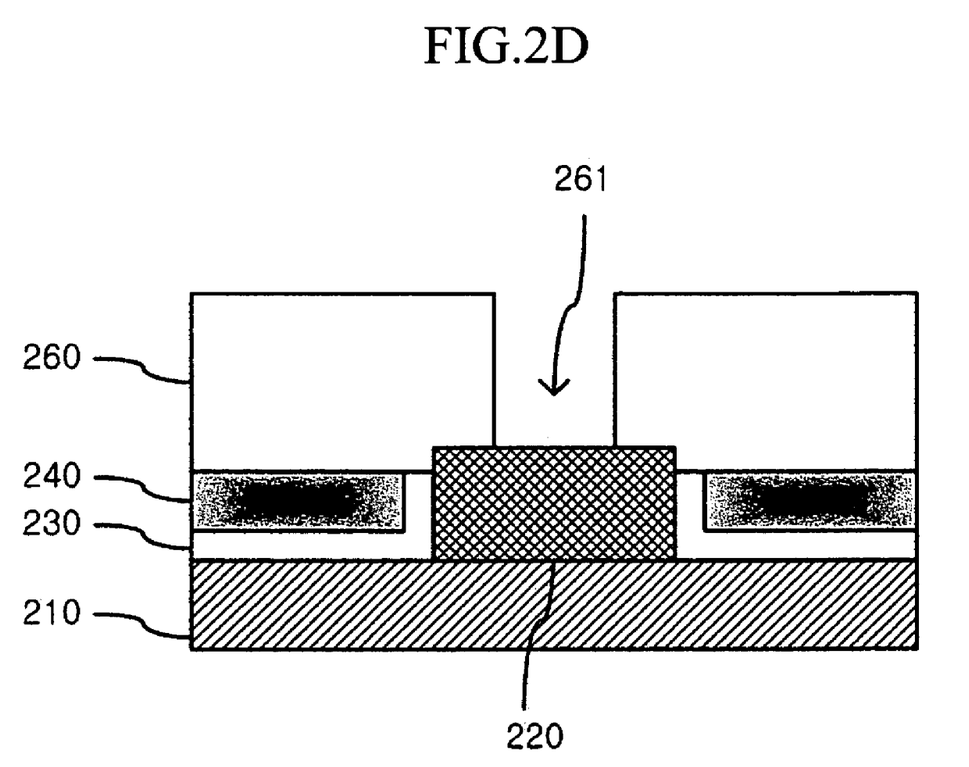

As shown in FIG. 2D, a contact hole 261 is formed by etching the upper interlayer insulation layer 260 with the use of the mask pattern 270. Here, the protection oxide layer 230 and the FSG layer 240 are not exposed by the formation of contact hole 261.

Figure 2E:
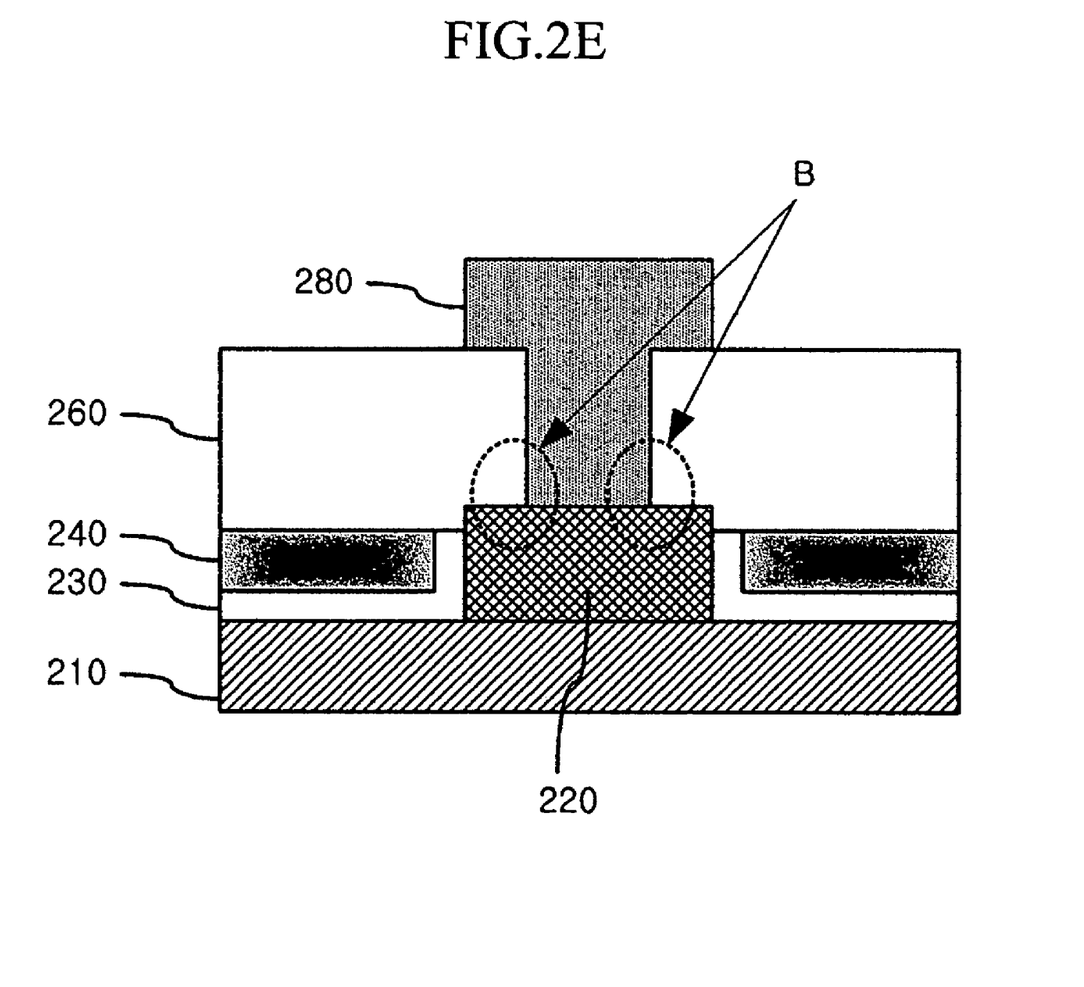

As shown in FIG. 2E, a second metal line 280 in contact with the metal line 220 is formed by filling the contact hole 261 with a metal material. Here, the connecting region between the first metal line 220 and the second metal line 280 has a smaller width than the first metal line 220.

According to an exemplary embodiment consistent with the present invention, the interlayer insulation layer 260 including the contact hole 261 is formed after etching the oxide layer 230, the FSG layer 240, and the sacrificial oxide layer 250, and then the second metal line 280 is formed in the contact hole 261. Therefore, as shown by B in FIG. 2E, the FSG layer 240 is not in contact with the first and second metal lines 220 and 280.

Accordingly, penetration of fluorine (F) in the FSG layer 240 into the metal lines 220 and 280 can be prevented.

According to an exemplary embodiment consistent with the present invention, since a metal line is formed so as to not contact an FSG layer, contamination of a metal line caused by fluorine in the FSG layer may be effectively prevented.

Therefore, contact resistance in a metal line may be reduced and operation speed of a semiconductor device may be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal line in a semiconductor device, the semiconductor device being electrically connected to a lower substrate and exposed upward, the method comprising:
    forming a lower insulation layer on the lower substrate;
    forming a first metal line on a part of the lower insulation layer;
    sequentially forming a first oxide layer, an FSG layer, and a second oxide layer on the lower insulation layer and the first metal line;
    removing the first oxide layer, the FSG layer, and the second oxide layer so as to expose the first metal line, wherein the second oxide layer on the lower insulation layer and the first metal line is completely removed;
    forming an upper insulation layer on the lower insulation layer and the first metal line;
    forming a contact hole by etching the upper insulation layer so as to expose the first metal line; and
    forming a second metal line by depositing a metal material in the contact hole.

2. The method of claim 1, wherein forming the second oxide layer comprises forming the second oxide layer from a material including a SOG material.

3. The method of claim 1, wherein forming the second oxide layer comprises forming the second oxide layer from a material including an $O_3$-TEOS (tetra-ethyl orthosilicate) material.

4. The method of claim 1, wherein removing the first oxide layer, the FSG layer, and the second oxide layer comprises removing with a CMP (chemical mechanical polishing) process.

5. The method of claim 1, wherein removing the first oxide layer, the FSG layer, and the second oxide layer comprises removing with an etch-back process.

6. The method of claim 1, wherein forming the first metal line and the second metal line comprises forming the first metal line and the second metal line to contact at a connecting region, wherein the connecting region has a smaller width than that of the first metal line.

7. A semiconductor device comprising;
  a first metal line formed on a lower insulation layer and having first and second sidewalls;
  a first oxide layer formed on the lower insulation layer, wherein the first oxide layer encloses the first and second sidewall and partially contacts an upper insulation layer;
  an FSG layer formed between the first oxide layer and the upper insulation layer;
  a contact hole formed in the upper insulation layer; and
  a second metal line formed in the contact hole, and contacting the first metal line at a connecting region.

8. The semiconductor device of claim 7, wherein the connecting region has a smaller width than a width of the first metal line.

* * * * *